United States Patent
Geng et al.

(10) Patent No.: US 11,630,023 B2
(45) Date of Patent: Apr. 18, 2023

(54) TOOL-LESS TRAY, LEAKAGE SENSING DEVICE, AND TRAY MOUNTING METHOD

(71) Applicants: INVENTEC (PUDONG) TECHNOLOGY CORPORATION, Shanghai (CN); INVENTEC CORPORATION, Taipei (TW)

(72) Inventors: Zhao Geng, Shanghai (CN); Zhifa Chen, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 400 days.

(21) Appl. No.: 16/796,774

(22) Filed: Feb. 20, 2020

(65) Prior Publication Data
US 2021/0212235 A1 Jul. 8, 2021

(30) Foreign Application Priority Data
Jan. 3, 2020 (CN) .......................... 202010006247.X (51) Int. Cl.
*G01M 3/16* (2006.01)
*H05K 7/14* (2006.01)
*G01M 3/18* (2006.01)
*H05K 7/20* (2006.01)

(52) U.S. Cl.
CPC .............. *G01M 3/16* (2013.01); *G01M 3/182* (2013.01); *H05K 7/14* (2013.01); *H05K 7/1489* (2013.01); *H05K 7/20781* (2013.01)

(58) Field of Classification Search
CPC ........ G01M 3/16; G01M 3/181; G01M 3/182; H05K 7/14; H05K 7/20272
See application file for complete search history.

(56) References Cited

U.S. PATENT DOCUMENTS

| 6,036,071 A * | 3/2000 | Hartmann | B60R 11/00 224/555 |
| 7,441,744 B2 * | 10/2008 | Chen | G11B 33/124 |
| 8,223,501 B2 * | 7/2012 | Wu | G06F 1/185 361/740 |
| 9,105,309 B2 * | 8/2015 | Li | G11B 33/128 |

FOREIGN PATENT DOCUMENTS

JP 2006052541 A * 2/2006

* cited by examiner

*Primary Examiner* — Erika J. Villaluna
(74) *Attorney, Agent, or Firm* — Maschoff Brennan (57) ABSTRACT

The invention relates to detection technology field and provides a tool-less tray that is detachably mounted on a casing inner wall. The tray has a plate body and a side wall; at least 3 shaped holes are disposed on the side wall; at least one screw pillar is fixed to the plate body and is configured to be firmly connected to an additional function board. The technical solution provided by the invention is tool-less, realizes fast installation and detachment of tray, realizes fast addition and removal of additional function board in limited space and is convenient to be used.

7 Claims, 7 Drawing Sheets

TOOL-LESS TRAY, LEAKAGE SENSING DEVICE, AND TRAY MOUNTING METHOD

CROSS-REFERENCE TO RELATED APPLICATIONS

This non-provisional application claims priority under 35 U.S.C. § 119(a) on Patent Application No(s). 202010006247.X filed in China, on Jan. 3, 2020, the entire contents of which are hereby incorporated by reference.

BACKGROUND OF THE INVENTION

Technical Field of the Invention

The invention relates to detecting technical field, more particularly to a tool-less tray, a leakage sensing device, and a mounting method of the tray.

Description of the Related Art

With the development of electronic technology in China, more and more electronic devices have been widely used. A large amount of information technology devices are placed together in host casings in data centers. The data centers have various types of servers, storage units, exchangers, a large amount of cabinets, and other basic facilities. Each type of information technology device is composed of various types of hardware boards and there often are boards densely arranged in the host casing.

In order to effectively utilize the three-dimensional space in the host casing, some of the boards are fixed to the host casing wall via trays, and the boards and motherboard then are connected via cables. In general, the tray is mounted via screws. That is, the tray has first screw hole and the host casing has second screw hole in a position corresponding to that of the first screw hole, a screw is then sequentially screwed into the first screw hole and the second screw hole, and a tool such as screwdriver is used to fixed the tray to the host casing wall.

Such installation manner has the following disadvantages:

(1) With the development of small size expansion module (including the host casing), the space for the installation of the tray for mounting the expansion module is significantly reduced, and thus, due to the space limitation, the installation and detachment are troublesome if the screw fixation manner is applied.

(2) The installation or detachment of the tray only can be implemented with the help of the tool, which is unable to meet the requirement of rapidly installing internet expansion module, thereby severely affecting the efficiency of production line operation.

(3) Screw may go missing while being used for the installation, and since the screw is made of metal material, safety problems may be introduced if the screw is left in the host casing.

Thus, the person skilled in the art faces a technical problem that how to efficiently and safely install the tray to save time and labor cost.

In addition, for the electronic device, such as a server, that requires to operate for a long time, the heat dissipation is a problem. Currently, most of heat dissipation systems adapt air-cooling technology. However, the air-cooling technology is not suitable for the products that consume massive power. Therefore, the disadvantages of the air-cooling technology, such as high power consumption, high noise, and low device density become much obvious, so the invention adapts liquid-cooling technology in some specific models.

Since the currently used coolant has a certain level of electrical conductivity, if the leakage occurs, the system may be severely damaged. Thus, leakage detection is an indispensable security measure to a liquid-cooling system.

Regarding the leakage detection, there are existing products in the current market but are designed for daily usage and industrial production, and they would have the following disadvantages when applied to our products:

1) Difficult to determine the position for the installation. Since there are many detection points to be detected and detection devices have to be placed on the same tray, connection lines are arranged in a messy manner;

2) Interface connection is inconvenient. Interfaces of sensing line and output signal are fixed via screws since they are mainly designed for daily usage and industrial production, which is inconvenient during installation;

As such, for the host casing adapting the liquid-cooling technology, how to arrange the leakage sensing device in a convenient manner becomes another technical problem.

SUMMARY OF THE INVENTION

The above technical problems would be solved by one technical solution. The first is to design a tool-less tray that can be installed in a convenient manner, and then is to design a leakage sensing printed board with a connector fixed in advance. Fixing the printed board on the tray can dispose the leakage sensing device in a suitable position in the host casing. The leakage sensing line can be fixed to the leakage sensing printed board via the connector, and if necessary, a connector with a lock device may be further selected.

The invention is to provide a tool-less tray that is detachably installed on a host casing inner wall and has a plate body and a side wall; at least three shaped holes are disposed on the side wall; at least one threaded pillar is fixed on the plate body, for being fixed and connected to an additional function board.

In the aforementioned tool-less tray, the plate body and the side wall have an angle greater than 0° but less than or equal to 180° therebetween.

In the aforementioned tool-less tray, a handle for being held is disposed on a side of the plate body that is located opposite to the side wall.

In the aforementioned tool-less tray, the shaped hole is in a four-point star shape, a head part of an I-shaped fastener may be disposed through its center, and a width between its four points matches that of a neck part of the I-shaped fastener.

In the aforementioned tool-less tray, the shaped hole is in an inverted T shape, the head part of an I-shaped fastener may be disposed through its bottom part, and a width of its top part matches that of a neck part of the I-shaped fastener.

In the aforementioned tool-less tray, an elastic latch is fixed to the side wall, the elastic latch has an engagement hole for the engagement with an engagement component to restrict the tray from sliding leftwards, rightwards, upwards, and downwards.

In the aforementioned tool-less tray, the elastic latch further includes a handle-like extension part; when the tray is detached, the extension part is pulled so that the engagement component is detached from the engagement hole.

In the aforementioned tool-less tray, a plurality of the I-shaped fasteners are fixed to the host casing inner wall by riveting or welding, and their positions correspond to that of the shaped holes.

In the aforementioned tool-less tray, the engagement component is in a semicircular shape or is a cylindrical protrusion.

Another purpose of the invention is to provide a leakage sensing device that is configured to monitor the leakage of the liquid-cooling component, and includes the aforementioned tray and a leakage sensing printed board; the leakage sensing printed board is fixed to the threaded pillar of the plate body via screw and has a sensing interface configured for being connected to the leakage sensing line.

In the aforementioned leakage sensing device, the handle and the elastic latch on the tray both are disposed on inner side of the tray, and the leakage sensing printed board is disposed on outer side of the tray.

In the aforementioned leakage sensing device, the leakage sensing line is irregularly wound on the cold water tube and the hot water tube of the liquid-cooling component, and the connector of the leakage sensing line is plugged into the sensing interface.

In the aforementioned leakage sensing device, a wounding density of the leakage sensing line around water inlets and water outlets of a cold water tube and a hot water tube is larger than a wounding density of the leakage sensing line around middle parts of the cold water tube and the hot water tube.

In the aforementioned leakage sensing device, the leakage sensing printed board further has a signal interface providing information indicating whether the leakage occurs at the liquid-cooling component and where the leakage occurs.

The invention further provides an installation method of a tray including following steps:

S1, installing a plurality of I-shaped fasteners and an engagement component on an inner side of the host casing;

S2, inserting the I-shaped fastener into the shaped hole, and then pushing downwards to engage a neck part of the I-shaped fastener with the shaped hole;

S3, pushing the tray toward an outer side of the host casing to tightly engage the engagement component with the engagement hole of the elastic latch on the side wall.

In the aforementioned installation method of the tray, the step of detaching the tray includes following steps:

S5, pulling the elastic latch toward inner side of the host casing;

S6, simultaneously pulling upwards the handle-like extension part on the plate body.

Comparing to the related art, the tool-less tray provided by the technical solution of the invention embodies a tool-less hanging by the cooperation of the shaped hole and the I-shaped fastener, and further fixes the tray via the engagement component to prevent it from freely shaking (slight movement), thereby achieving fast installation and reducing the risk that screw or the like would be left in the host casing. Comparing to the related art, maintenance staff does not need to sequentially handle every pin or screw, saving time and labor cost.

Further, installing the leakage sensing printed board on the tray configures a leakage sensing device. Since the leakage sensing device is not required to be installed in all of the host casing in advance, the tray can be conveniently installed in required host casing, thereby improving detaching efficiency of the leakage sensing device and overcoming various problems in the related art and thus having high industrial value.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In order to make the purposes and features of the invention apparent, embodiments of the invention are further described together with the appending drawings. However, the invention may be implemented in different manners, and not limited to the following embodiments. Also, embodiments and features of the embodiments are allowed to be combined if there are no confliction therebetween. Upon following illustration, advantages and features of the invention will be more clear.

It is explained that the appending drawings are simplified, the ratio of the appending drawings are not accurate, and the appending drawing are only configured for illustrating purposes of the embodiments of the invention in a convenient and clear manner.

It is claimed that, reference numbers of the steps in this invention are only for the purpose of citation and not intended to limit the order. For the steps whose order is required to be highlighted, such order will be explained by specific words.

Seaking host casing is a standard server host casing developed by our company, it is able to satisfy most clients requirements in hardware setting of 2U host casing, inner portion of the corresponding host casing is highly modularized and having high replaceability. With the rapid development of cloud computing, heat dissipation becomes a great limitation in server development. Also, the next generation also advocates the apparatus with green energy, so liquid-cooling component and associated leakage sensing device are introduced in the Seaking host casing. Considering that the Seaking host casing is a molded product and its hardware arrangement have been fixed, the leakage sensing device is decided to be hung in back window of the host casing after thorough consideration, reducing the original arrangement inside the host casing as possible. However, adapting the typical screw fixation manner would affect the maintenance of motherboard. Since the aforementioned leakage sensing device is hung above the motherboard, it must take a time-consuming process to detach the leakage sensing device when the motherboard is required to be maintained.

The purpose of the invention is to install the leakage sensing device in a fast and convenient manner. The main idea of the invention is to firstly design a tray 17 that can be easily detached and installed and to fix the leakage sensing board on the tray 17 so as to form a leakage sensing device that can be easily detached and installed. Extending to various other host casings and function devices of our company, the idea is to standardize the designs of the host casing and the tray 17, using consistent hole sizes, hole gaps to manufacture the I-shaped fastener on the host casing and the shaped hole on the tray 17, when needed, corresponding function printed board is fixed to the tray 17, forming function device, and the said function device can be freely hung on the host casing inner wall in a handy manner. In specific, the relative position relationship between the shaped hole and I-shaped fastener is shown by dotted lines in FIG. 6.

Figure 6:
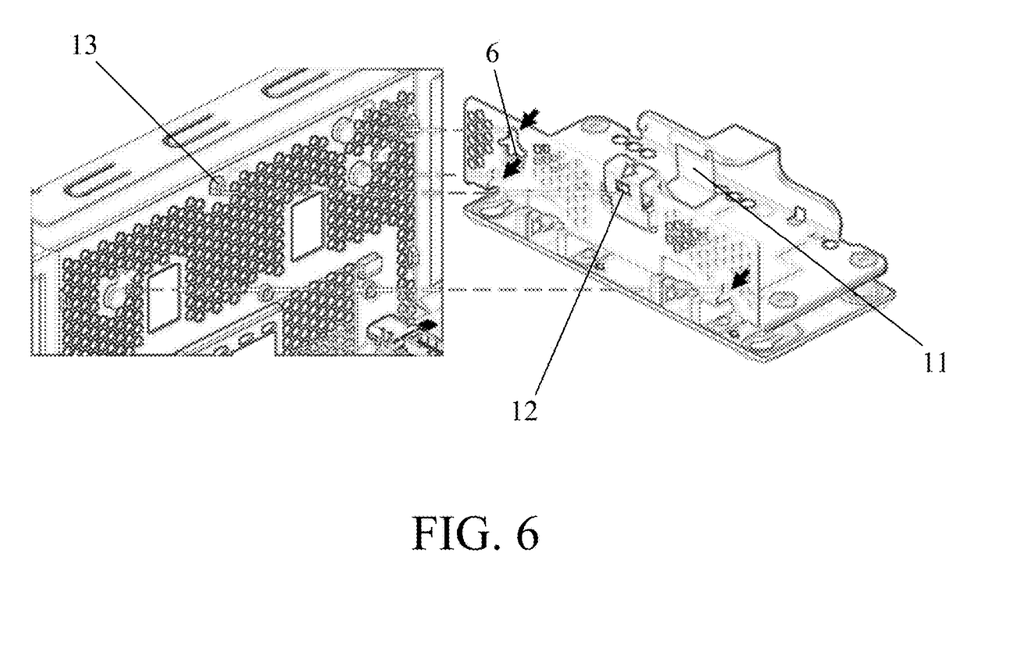
FIG. 6 schematically shows the correspondence of the shaped hole and I-shaped fastener in FIG. 5.
Figure 7:
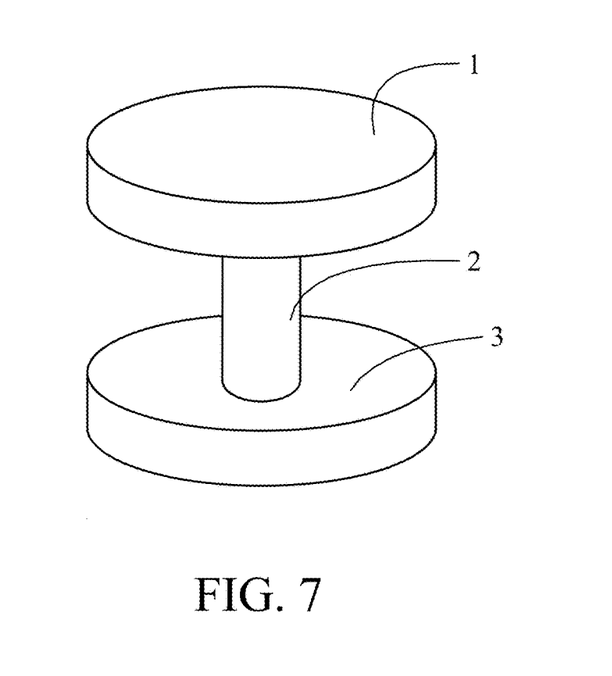
FIG. 7 schematically shows the I-shaped fastener of the invention.

One of the components of an embodiment of the invention is firstly described: I-shaped fastener. As shown in FIG. 6, the I-shaped fastener is a common mechanical component that has a head part 1, a neck part 2, and a base 3. In practical, for the purpose of manufacturing, the head part 1 is generally identical to the base 3. In this invention, the base 3 of the I-shaped fastener is fixed to the host casing inner wall by, for example, riveting or welding, and if there is a suitable material, they also can be fixed via adhesive. During the installation of the tray 17, the head part 1 is inserted into the shaped hole of the tray 17 so that the head part 1 is disposed through the shaped hole, and thus the shaped hole is hung on the neck part 2. Then, the said tray 17 is slightly pushed so that the neck part 2 is engaged in the narrower portion of the shaped hole, thereby achieving stable hanging function device.

Figure 3:
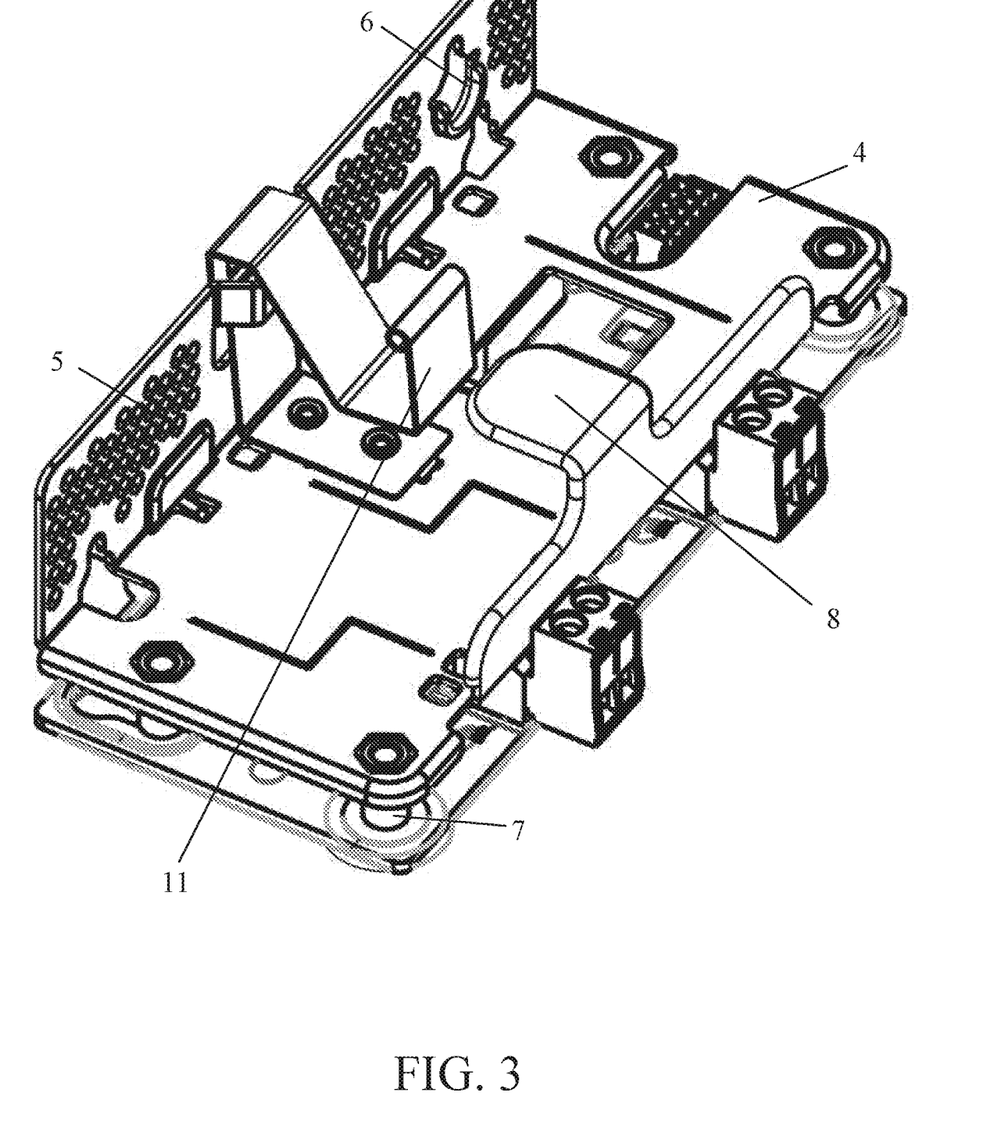
FIG. 3 is a schematic installation diagram of one embodiment of the invention.
Figure 4:
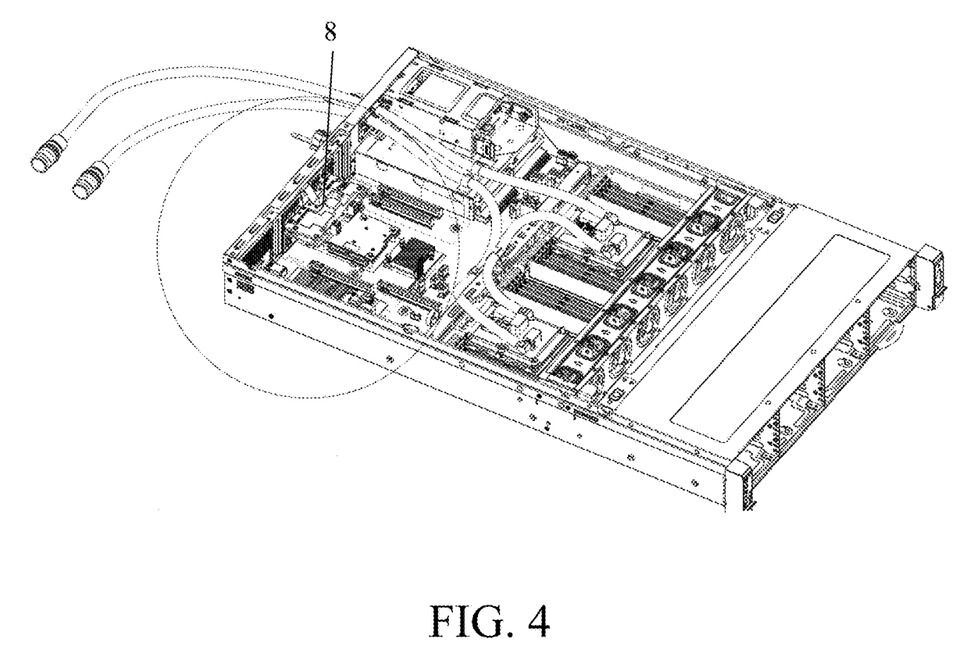
FIG. 4 is a schematic diagram showing installation function of one embodiment of the invention.
Figure 5:
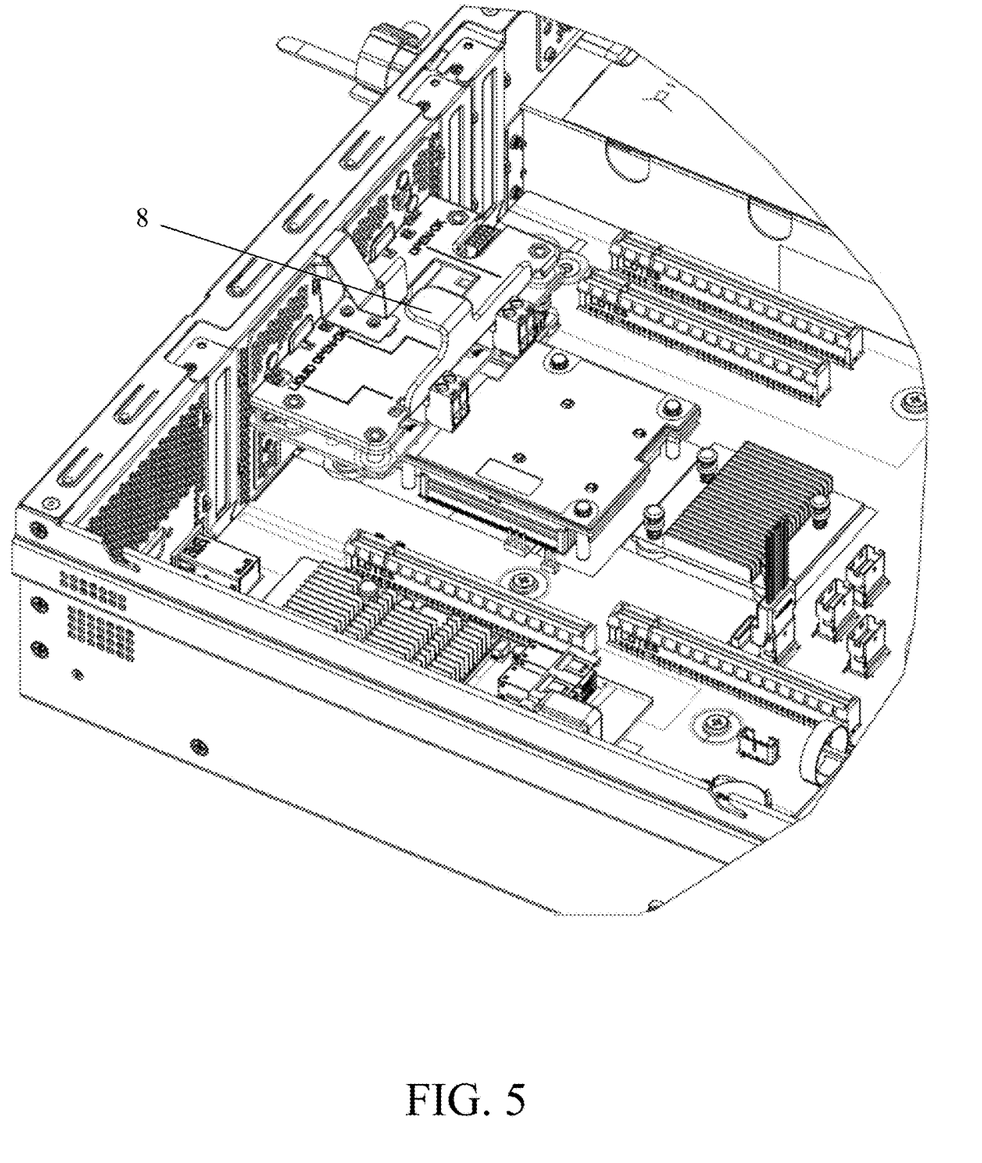
FIG. 5 is a partially enlarged diagram of FIG. 4.

The invention further provides a tool-less tray 17, when using, it is detachably installed on a host casing inner wall so as to conveniently add or remove the function devices in the host casing. As shown in FIG. 3 to FIG. 5, the tool-less tray 17 has a plate body 4 and a side wall 5. A plurality of shaped holes are disposed on the side wall 5, considering that three points define a plane, in this embodiment, there are three shaped holes for hanging. A plurality of threaded pillars 7 with inner screw threads are fixed on the plate body 4 for connecting function printed board for later use. According to the size of the said function printed board, there may be one, two or three threaded pillars 7. Considering the area of the hang-type tray 17, the amount of the threaded pillar 7 is preferably less than or equal to six.

Further, in the drawings, the plate body 4 and the side wall 5 have an angle of 90° therebetween, which is a common angle arrangement in mechanical manufacturing. However, in order to adapt the limitation of various installation spaces in host casing, the plate body 4 and the side wall 5 may have another angle that is larger than 0° and less than or equal to 180°.

Considering the convenience during detachment, the handle 8 is further disposed on the plate body 4. The handle 8 and the side wall 5 are respectively disposed on two opposite sides of the plate body 4. In specific, if the space is sufficient, the handle 8 and the plate body 4 may be on the same plane, that is to say, a protrusion protruding from the plate body 4 for being held by hand is used as the handle 8. If the outer space of the tray 17 is insufficient, as shown in FIG. 5, a structure protruding from the edge of the plate body 4 for being held by hand is used as a handle.

Figure 8:
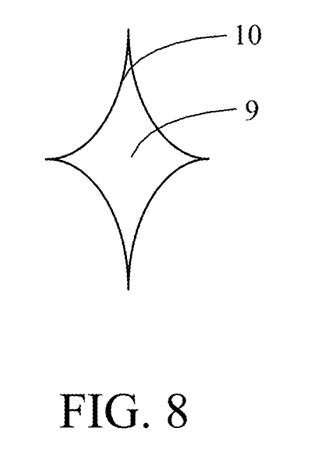
FIG. 8 shows an example of the shaped hole.
Figure 9:
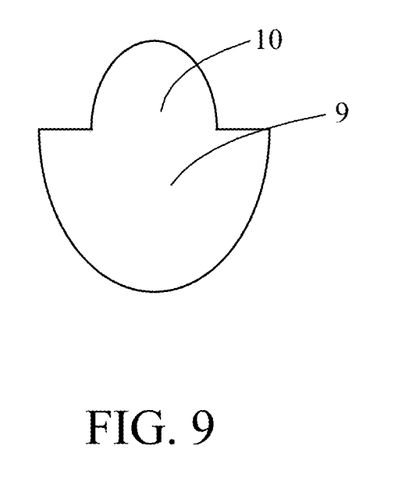
FIG. 9 shows another example of the shaped hole.

Further, the shaped hole 6 may be in a four point star shape or in an inverted T shape. FIG. 8 shows the shaped hole in four point star shape. As show, the effective width of the center 9 is equal to the diameter of the head part 1 of the aforementioned I-shaped fastener, allowing the penetration of the I-shaped fastener, and the width of the narrower portion 10 (i.e. pointy part) is equal to the diameter of the neck part 2 of the aforementioned I-shaped fastener, allowing the tray 17 to be tightly fixed and engaged. FIG. 9 shows the shaped hole that is in an inverted T shape. In the drawing, effective width of center 9 (i.e. the bottom part of the inverted T shape) is equal to the diameter of the head part 1 of the aforementioned I-shaped fastener, allowing the penetration of the I-shaped fastener, and the width of the narrower portion 10 (i.e. the top part of the inverted T shape) is equal to the diameter of the neck part 2 of the I-shaped fastener, allowing the tray 17 to be tightly fixed and engaged.

Further, as shown in FIG. 6, an elastic latch is further fixed to the side wall 1, and an engagement hole 12 that is in square shape is disposed on the elastic latch for the engagement with an engagement component 13 so as to restrict the tray 17 from sliding leftwards, rightwards, upwards and downwards. The relative position relationship between the engagement hole 12 and the engagement component 13 is shown by the dotted lines in the drawings. In specific, the engagement component 13 is disposed on the host casing inner wall, and is a semi-circular protrusion or cylindrical protrusion protruding from host casing inner wall. In order to improve the fixing function, the width of the engagement hole 12 is generally equal to, preferably equal to or slightly less than, the maximum diameter of the engagement component 13.

Further, the elastic latch further includes a handle-like extension part 11; during the removal of the tray 17, the handle-like extension part 11 is pulled so that the engagement hole 12 is detached from the engagement component 13.

Figure 1:
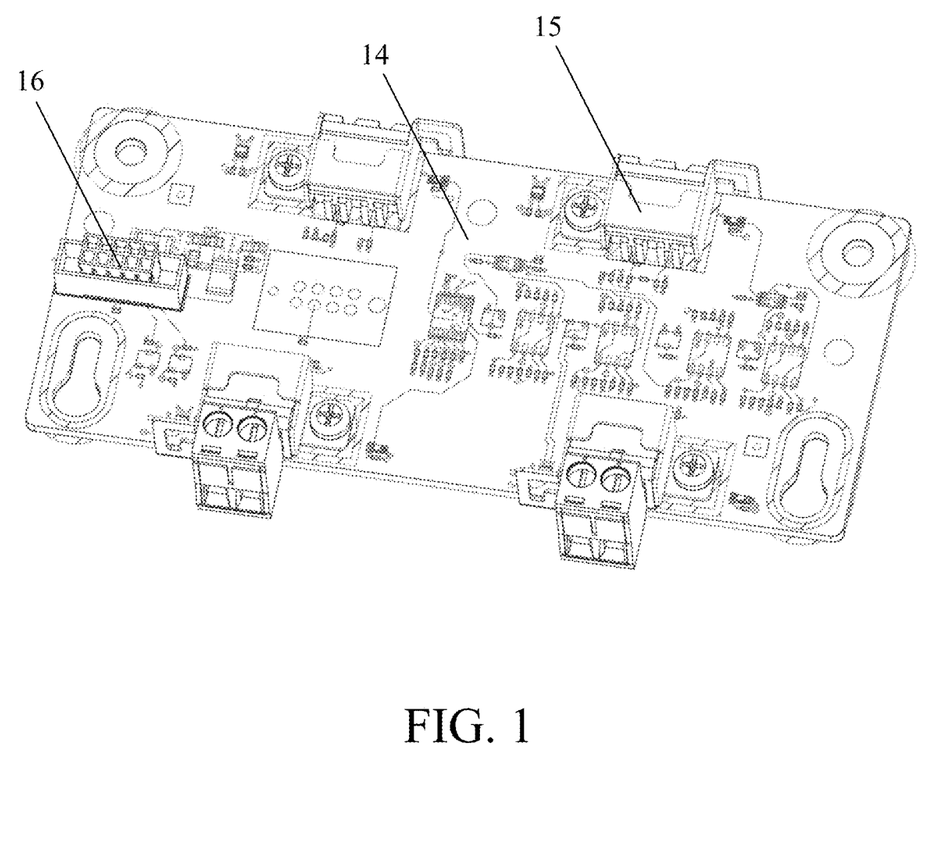
FIG. 1 is a schematic diagram of a leakage sensing plate of the invention.
Figure 2:
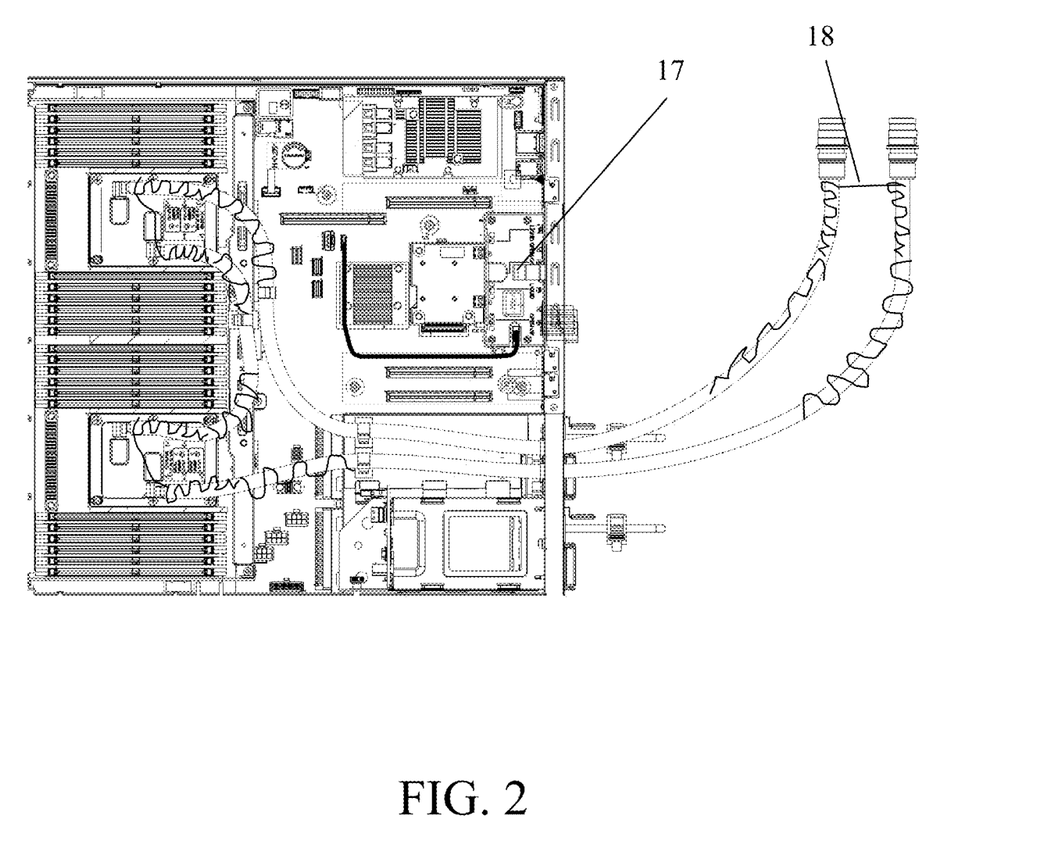
FIG. 2 is a schematic arrangement diagram of cold and hot water tubes and a leakage sensing line of the invention.

As shown in FIG. 1 and FIG. 2, the leakage sensing printed board 14 shown in FIG. 1 is fixed to the threaded pillar 7 on the tray 17 via screw so as to form the leakage sensing device. The leakage sensing device is configured to monitor the leakage condition of the liquid-cooling component. In specific, there are two sets of sensing interfaces 15, that are configured to be connected to the leakage sensing line 18, disposed on the leakage sensing printed board 14. There are two leakage sensing lines 18. One is configured to sense the leakage condition of the cold and hot water tubes in the host casing, and the other one is configured to sense the leakage condition of the cold and hot water tubes outside the host casing (i.e. on the base frame). The connectors of the two leakage sensing lines are respectively inserted into the two sets of sensing interfaces 15. Also, a signal interface 16 is further disposed on the leakage sensing printed board 14, and the signal interface 16 is configured to provide the information indicating whether the leakage occurs at the liquid-cooling component and where the leakage occurs, and such information is transmitted to the motherboard of the host casing via signal line.

Further, referring to both of FIG. 3 and FIG. 5, when the handle 8 is configured as shown, the handle 8 and the elastic latch are disposed on inner side of the tray 17, and the leakage sensing printed board 14 is disposed on outer side of the tray 17.

As shown in FIG. 2, the leakage sensing line is mainly wound on the cold water tube and the hot water tube of the liquid-cooling component in an irregular manner, wound in a denser manner near water inlet and water outlet of the cold water tube and the hot water tube, wound in a more sparse manner near middle parts of the cold water tube and the hot water tube, and there even may be no leakage sensing line disposed on the middle parts. Such winding manner increases the detection range of the detection device, effectively improves the sensitivity of leakage detection, and increases leakage detection rate.

Adapting to the aforementioned tray 17, the invention further provides a concrete installation and detachment method.

Specifically, the installation method includes following steps:

S1, installing a plurality of I-shaped fasteners and an engagement component on inner side of the host casing;

S2, inserting the I-shaped fastener into the shaped hole, and then pushing downwards so that the neck part of the I-shaped fastener is engaged with the shaped hole;

S3, pushing the tray toward outside direction of the host casing so that the engagement component is tightly engaged with the engagement hole of the elastic latch on the side wall.

In contrast, detachment method includes following steps:

S5, pulling the elastic latch toward inner side of the host casing;

S6, simultaneously pulling the handle-like extension part on the plate body upwards.

After step S6, the tray can be removed.

Alternatively, during the industrial production of the host casing, the I-shaped fastener and the engagement component are installed at a position that is more available using consistent hole sizes and hole gaps in advance, or the I-shaped fastener and the engagement component are directly and integrally formed on the host casing wall, thereby allowing step S1 to be omitted.

Similarly, the tray 17 may have the shaped hole based on the same standard, and during the massive production from now on, since the I-shaped fastener and the engagement component are arranged on the host casing in advance, it would be convenient to add additional function devices.

The tool-less tray 17 and the leakage sensing device can be used in a convenient manner, improving space utilization, saving more labor cost on installation and detachment, providing good solution for the flexibility in changing server functions, and it is suitable for the compacter inner space of the server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A leakage sensing device, configured to monitor leakage of a liquid-cooling component, the leakage sensing device comprising a tray and a leakage sensing printed board; the tray detachably installed on an inner wall of a host casing, the tray having a plate body and a side wall; at least three shaped holes disposed on the side wall; at least one threaded pillar fixed on the plate body and configured to be fixed and connected to an additional function board, an elastic latch is fixed to the side wall, the elastic latch has an engagement hole for the engagement of an engagement component to restrict the tray from sliding leftwards, rightwards, upwards and downwards; the leakage sensing printed board fixed to the at least one threaded pillar of the plate body via a screw and has a sensing interface configured to be connected to a leakage sensing line.

2. The leakage sensing device according to claim 1, wherein a handle is disposed on a side of the plate body that is located opposite to the side wall, and the handle is configured for being held.

3. The leakage sensing device according to claim 1, wherein one of the at least three shaped holes is in a four-point star shape, a head part of an I-shaped fastener is allowed to be disposed through its center, and a width of its four points matches a neck part of the I-shaped fastener; or one of the at least three shaped holes is in an inverted T shape, a head part of an I-shaped fastener is allowed to be disposed through its bottom part, and a width of its top part matches a neck part of the I-shaped fastener.

4. The leakage sensing device according to claim 1, wherein the elastic latch further includes a handle-like extension part, the extension part is moved so that the engagement component is detached from the engagement hole, thereby detaching the tray.

5. The leakage sensing device according to claim 4, wherein the engagement component is in a semicircular shape or is a cylindrical protrusion.

6. The leakage sensing device according to claim 1, wherein a handle and an elastic latch on the tray both are disposed on inner side of the tray, and the leakage sensing printed board is disposed on outer side of the tray.

7. The leakage sensing device according to claim 1, wherein the leakage sensing line is irregularly wound on a cold water tube and a hot water tube of the liquid-cooling component, a connector of the leakage sensing line is plugged into the sensing interface, and a wounding density of the leakage sensing line around a plurality of water inlets and a plurality of water outlets of the cold water tube and the hot water tube is larger than a wounding density of the leakage sensing line around a plurality of middle parts of the cold water tube and the hot water tube.

\* \* \* \* \*